United States Patent
Kajiyama

(10) Patent No.: US 8,022,439 B2
(45) Date of Patent: Sep. 20, 2011

(54) SEMICONDUCTOR DEVICE COMPRISING GATE ELECTRODE SURROUNDING ENTIRE CIRCUMFERENCE OF CHANNEL REGION AND METHOD FOR MANUFACTURING THE SAME

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 12/636,633

(22) Filed: Dec. 11, 2009

(65) Prior Publication Data
US 2010/0320504 A1    Dec. 23, 2010

(30) Foreign Application Priority Data
Jun. 19, 2009   (JP) ................. 2009-146795

(51) Int. Cl.
- H01L 31/0336 (2006.01)
- H01L 31/109 (2006.01)
- H01L 21/8234 (2006.01)
- H01L 21/336 (2006.01)
- H01L 29/78 (2006.01)

(52) U.S. Cl. ......... 257/192; 257/E21.625; 257/E29.264; 257/E21.421; 438/275

(58) Field of Classification Search .......... 257/192, 257/E21.625, E29.264, E21.421; 438/275
See application file for complete search history.

(56) References Cited

U.S. PATENT DOCUMENTS

| | | | |
|---|---|---|---|
| 5,583,362 A | 12/1996 | Maegawa | |
| 7,115,476 B1 * | 10/2006 | Izumida | 438/268 |
| 7,242,021 B2 * | 7/2007 | Yamazaki et al. | 257/59 |
| 7,375,397 B2 * | 5/2008 | Shizuno | 257/347 |
| 7,709,368 B2 * | 5/2010 | Sasagawa | 438/618 |
| 7,763,981 B2 * | 7/2010 | Yamazaki et al. | 257/774 |
| 7,932,602 B2 * | 4/2011 | Katagiri | 257/758 |
| 2005/0176186 A1 | 8/2005 | Lee et al. | |

FOREIGN PATENT DOCUMENTS

JP    2005-229107    8/2005

OTHER PUBLICATIONS

Background Art Information and Explanation of Non-English Language Reference(s).

* cited by examiner

*Primary Examiner* — Luan C Thai
(74) *Attorney, Agent, or Firm* — Knobbe, Martens, Olson & Bear LLP

(57) ABSTRACT

Two first semiconductor layers are on a silicon substrate at a given distance from each other. Two second semiconductor layers are on the respective first semiconductor layers and includes a material different from a material of the first semiconductor layers. A first channel region is formed like a wire between the two second semiconductor layers. A first insulating layer is around the first channel region. A second insulating film is on each of opposite side surfaces of the two first semiconductor layers. A third insulating film is on each of opposite side surfaces of the two second semiconductor layers. A gate electrode is on the first, second, and third insulating films. Film thickness of the second insulating film is larger than film thickness of the first insulating film.

13 Claims, 8 Drawing Sheets

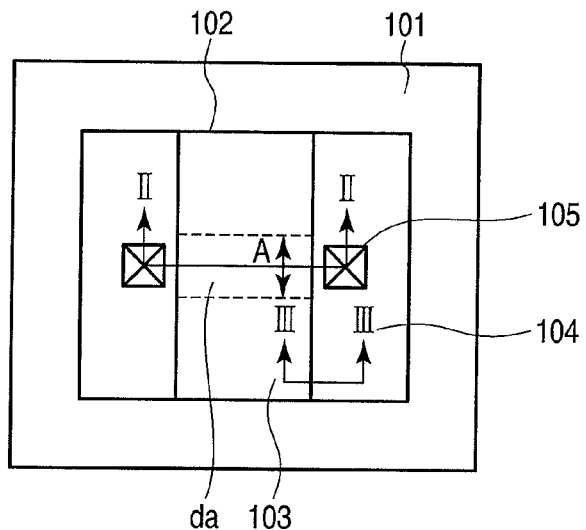
F I G. 1
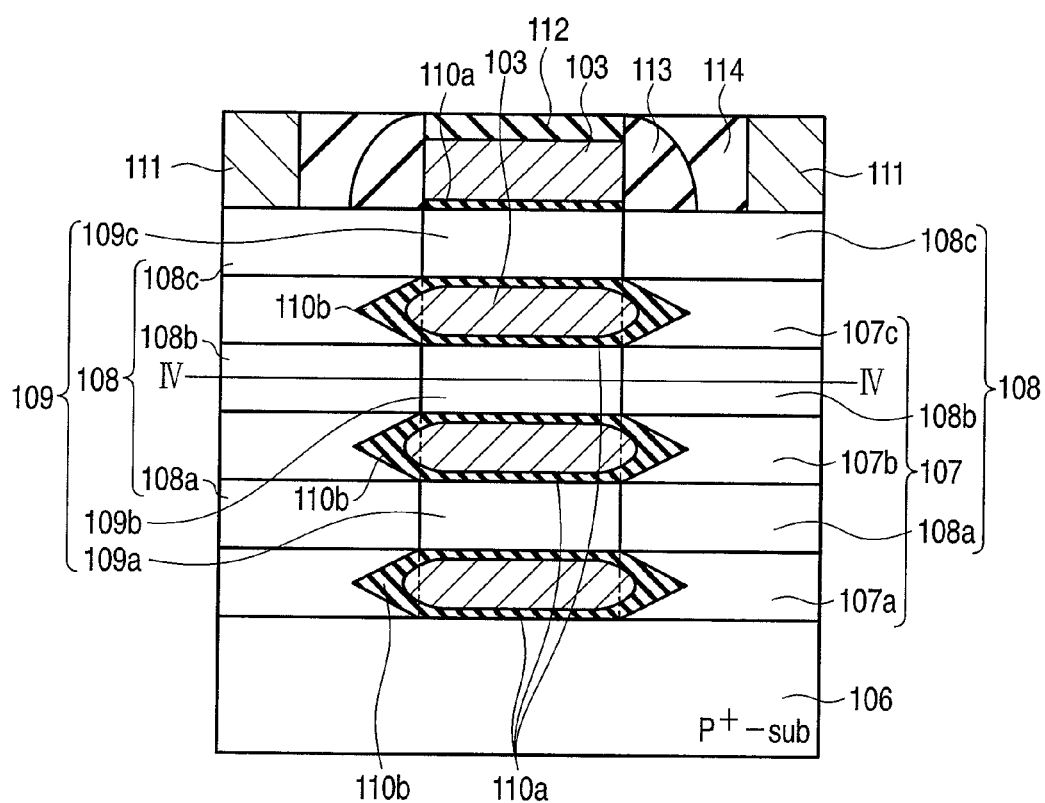
F I G. 2

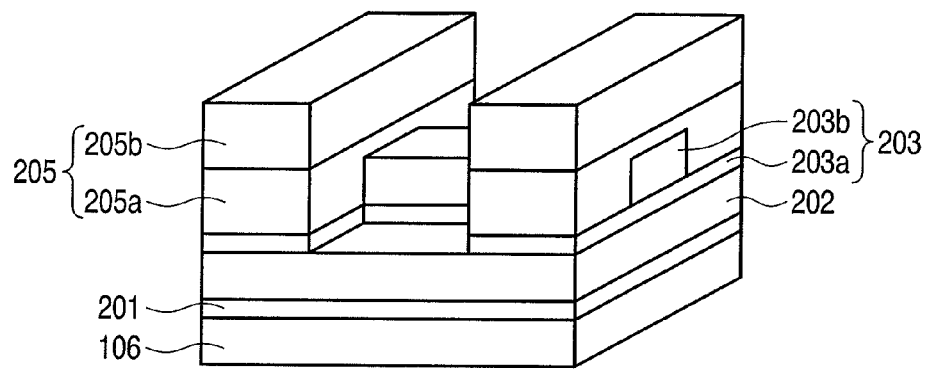
F I G. 12
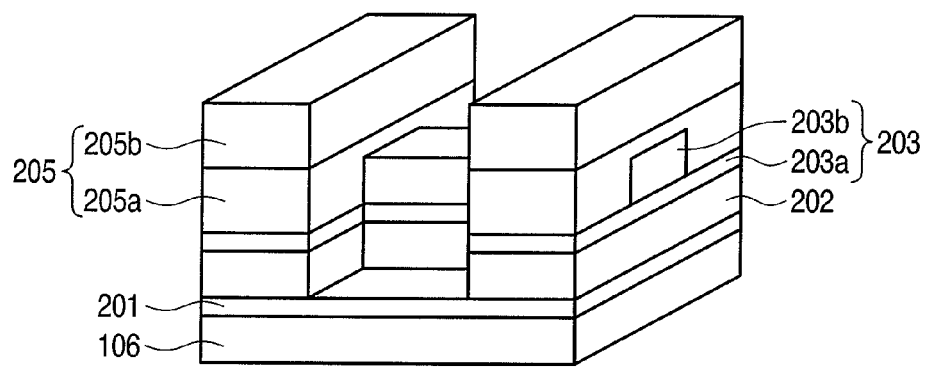
F I G. 13
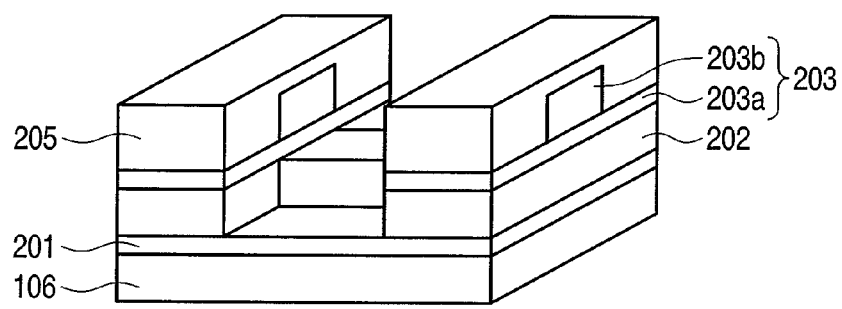
F I G. 14

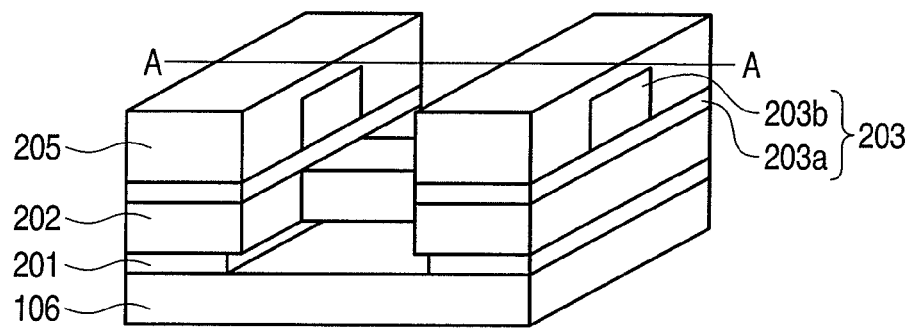
F I G. 15
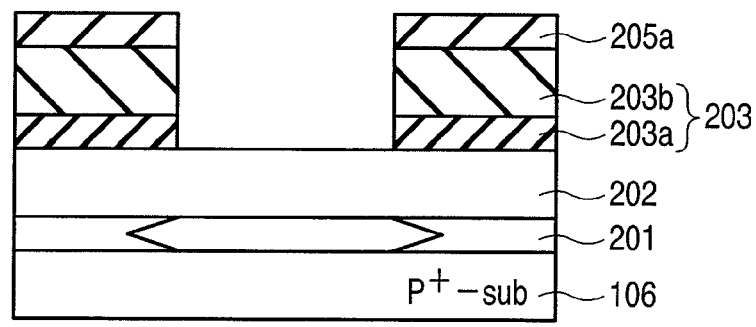
F I G. 16
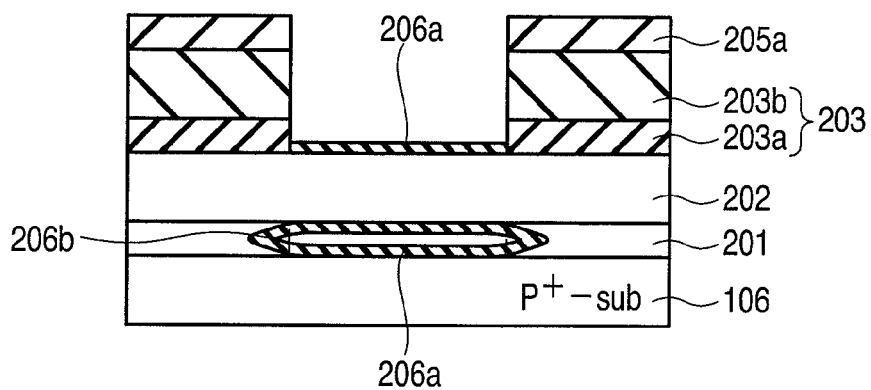
F I G. 17

SEMICONDUCTOR DEVICE COMPRISING GATE ELECTRODE SURROUNDING ENTIRE CIRCUMFERENCE OF CHANNEL REGION AND METHOD FOR MANUFACTURING THE SAME

CROSS-REFERENCE TO RELATED APPLICATIONS

This application is based upon and claims the benefit of priority from prior Japanese Patent Application No. 2009-146795, filed Jun. 19, 2009, the entire contents of which are incorporated herein by reference.

BACKGROUND OF THE INVENTION

1. Field of the Invention

The present invention relates to a semiconductor device, and in particular, to a semiconductor device in which a gate electrode is located so as to surround the entire circumference of a channel region, and a method for manufacturing the semiconductor device.

2. Description of the Related Art

In recent years, with the improved functions and integration of semiconductor integrated circuits, MOS transistors have been increasingly miniaturized. However, conventional MOS transistors have a small current on/off ratio. Thus, in order to provide a desired on current, the MOS transistor needs to be configured such that a gate electrode has an increased width or a plurality of gate electrodes are formed on the same plane. The increase in width and the formation of a plurality of gate electrodes on the same plane increase the area occupied by field effect transistors, disadvantageously hindering an increase in circuit density.

Thus, as a structure for obtaining the desired on current, for example, a gate-all-around (GAA) transistor has been proposed (see, for example, Jpn. Pat. Appln. KOKAI Application No. 2005-229107).

In the GAA transistor, the gate electrode is formed so as to wrap around a channel region. Thus, when a voltage is applied to the gate electrode, electric fields are likely to concentrate in the channel region. Thus, the on/off ratio of a switching current can be set to a large value. Furthermore, a large number of channels can be formed on the same plane, enabling an increase in on current.

However, in the conventional GAA transistor, a parasitic capacitance is produced on the side surfaces (the end surfaces of the gate in the longitudinal direction) and bottom surface of the gate electrode. In particular, a large parasitic capacitance is produced on the side surfaces of the gate electrode. In operation, this disadvantageously slows the speed at which the voltage of the gate electrode is increased or reduced in response to an applied voltage.

BRIEF SUMMARY OF THE INVENTION

According to an aspect of the first invention, there is provided a semiconductor device comprising: a silicon substrate; two first semiconductor layers on the silicon substrate at a given distance from each other; two second semiconductor layers on the respective first semiconductor layers and comprising a material different from a material of the first semiconductor layers; a first channel region formed like a wire between the two second semiconductor layers; a first insulating layer around the first channel region; a second insulating film on each of opposite side surfaces of the two first semiconductor layers; a third insulating film on each of opposite side surfaces of the two second semiconductor layers; and a gate electrode on the first, second, and third insulating films, wherein film thickness of the second insulating film is larger than film thickness of the first insulating film.

According to an aspect of the second invention, there is provided a method for manufacturing a semiconductor device, the method comprising: sequentially stacking a first semiconductor layer and a second semiconductor layer on a silicon substrate, the second semiconductor layer comprising a material different from a material of the first semiconductor layer; forming source/drain regions comprising the first semiconductor layer and the second semiconductor layer and a channel formation region comprising the first semiconductor layer and the second semiconductor layer by processing the second semiconductor layer, the channel formation region being positioned between the source/drain regions; forming a wire-like channel region comprising the second semiconductor layer by removing the first semiconductor layer in a lower part of the channel formation region by isotropic etching; forming a first insulating film, a second insulating film, and a third insulating film around the second semiconductor layer in the channel region, on a side surface of the first semiconductor layer in the source/drain regions, and on a side surface of the second semiconductor layer in the source/drain regions by performing a thermal treatment in an atmosphere containing gaseous oxygen; and forming a gate electrode on the first, second, and third insulating films, wherein film thickness of the second insulating film is larger than film thickness of the first insulating film.

BRIEF DESCRIPTION OF THE SEVERAL VIEWS OF THE DRAWING

FIG. 1 is a plan view showing the structure of a GAA transistor according to an embodiment of the present invention;

FIG. 2 is a sectional view along line II-II in FIG. 1;

FIGS. 5 to 15 are perspective views showing a process of manufacturing a GAA transistor according to the embodiment of the present invention; and FIGS. 16 to 21 are sectional views along line A-A in FIG. 15 and showing the process of manufacturing the GAA transistor according to the embodiment of the present invention.

DETAILED DESCRIPTION OF THE INVENTION

Figure 3:
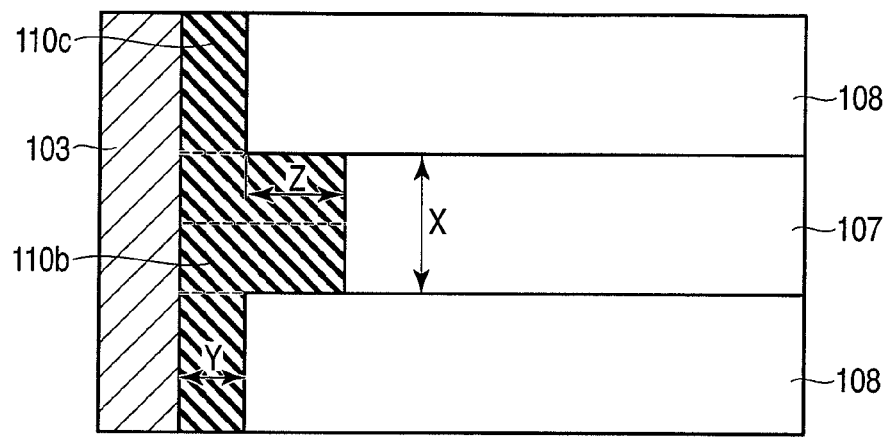
FIG. 3 is a partly enlarged view of a cross section along line III-III in FIG. 1.

In an example of the present invention, an insulating film formed between a side surface of a gate electrode and a side surface of a silicon germanium (SiGe) layer functioning as a source/drain region is thicker than an insulating film formed so as to wrap around the circumference of a nanowire channel.

To form this structure, isotropic etching is used to etch the SiGe layer formed in the lower part of the nanowire channel. A recess is formed in the sidewall of the SiGe layer remaining after the isotropic etching. An insulating film is formed so as to fill the recess. Then, a thick insulating film can be formed on the side surface of the SiGe layer.

Moreover, N-type impurities are doped in the SiGe layer. Thus, when the SiGe layer is annealed in an atmosphere containing gaseous oxygen, the impurities cause enhanced oxidation. This increases the speed at which an insulating film is formed on the side surface of the SiGe layer. As a result, a thick insulating film can be formed on the side surface of the SiGe layer.

Therefore, a parasitic capacitance produced between the gate electrode and the SiGe layer can be reduced. This enables a reduction in the adverse effect of the parasitic capacitance on the speed at which the voltage of the gate electrode is increased or reduced in response to an applied voltage.

An embodiment in which the present invention is carried out will be described below in detail.

(1) Device Structure

FIG. 1 is a plan view schematically showing a GAA transistor.

As shown in FIG. 1, one GAA transistor 102 is formed in a region surrounded by an isolation region 101. Source/drain regions 104 of the GAA transistor 102 are formed at a predetermined distance from each other. A gate electrode 103 is sandwichingly formed between the source/drain regions 104. Furthermore, a contact section 105 is formed in each of the source/drain regions 104 so as to contact an interconnection layer (not shown in the drawings).

The gate electrode 103 of the GAA transistor is formed so as to wrap around a channel region. That is, a nanowire channel circumferentially covered with the gate electrode 103 is formed in a dotted region da shown in FIG. 1. The nanowire channel has a channel width A. The channel width A is narrower than a width of the source/drain regions 104.

FIG. 2 is a sectional view along line II-II in FIG. 1.

As shown in FIG. 2, for example, SiGe layers 107a, 107b, and 107c and silicon (Si) layers 108a, 108b, and 108c are alternately stacked on a $P^+$-type silicon substrate 106. This stacked structure functions as the source/drain regions 104 of the GAA transistor. Two stacked structures as described above are formed at the predetermined distance from each other. A wire-like nanowire channel 109a composed of Si is formed between the two Si layers 108a in the stacked structure. Moreover, nanowire channels 109b and 109c are formed between the two Si layers 108b and between the two Si layers 108c, respectively, in the stacked structure.

In this manner, the GAA transistor comprises a plurality of channel regions in the same plane perpendicular to a silicon substrate 106.

Furthermore, gate insulating films 110a (first insulating films) are formed around the periphery of a nanowire channel 109. An insulating film 110b (second insulating film) is formed on each of the opposite side surfaces of SiGe layers 107. Moreover, an insulating film 110c (third insulating film) described below is formed on each of the opposite side surfaces of Si layers 108. The gate insulating films 110a and the insulating films 110b and 110c are formed of, for example, a silicon oxide film.

Moreover, the gate electrode film 103 is formed around the periphery of the nanowire channel 109 via the gate insulating film 110a.

A contact plug 111 is formed on the Si layer 108. Furthermore, an insulating film 112 is formed on a gate electrode 103 formed at the uppermost position. Moreover, insulating films 113 and 114 are formed between the gate electrode 103 and the contact plug 111.

In the present embodiment, a recess is formed in each of the opposite side surfaces of the two SiGe layers 107 formed at the same level. Moreover, the insulating film 110b is buried in the recess in the SiGe layer 107. Thus, the film thickness of the insulating layer 110b is larger than that of the gate insulating film 110a. This enables a reduction in a parasitic capacitance produced between the gate electrode 103 and the SiGe layer 107.

FIG. 3 is a partly enlarged view of a sectional view along line III-III in FIG. 1.

As shown in FIG. 3, the insulating film 110c is formed on the side surface of the Si layer 108. Here, the thickness of the SiGe layer 107 is defined as X. The thickness of the insulating layer 110c formed on the side surface of the Si layer 108 is defined as Y. The depth of the recess formed in the side surface of the SiGe layer 107 is defined as Z.

As shown in FIG. 1, the channel width of the nanowire channel 109 is defined as A. Then, $Z \geq 0.5A$. If isotropic etching is used to remove the SiGe layer 107 located in the lower part of the nanowire channel 109, the SiGe layer 107 is etched from the opposite ends of the layer in the channel width direction. That is, to allow the SiGe layer 107 located in the lower part of the nanowire channel 109 to be removed, the removal needs to start from each of the opposite ends of the layer in the channel width direction so as to cover half of the channel width A. Thus, the depth Z of the recess formed in the sidewall of the SiGe layer 107 is larger than half of the channel width A of the nanowire channel 109.

If the insulating film 110b does not fill the whole recess formed in the side surface of the SiGe layer 107 (the insulating film 110b is not completely buried in the recess), the film thickness Y of the insulating film 110c meets the condition $2Y < X$.

In this case, the gate electrode 103 is formed inside the recess formed in the side surface of the SiGe layer 107. In the present embodiment, the film thickness of the insulating film 110b is larger than that of the gate insulating film 110a. This enables a reduction in a parasitic capacitance produced between the gate electrode 103 and the SiGe layer 107.

Furthermore, If the insulating film 110b fills the whole recess formed in the side surface of the SiGe layer 107 (the insulating film 110b is completely buried in the recess), the film thickness Y of the insulating film 110c meets the condition $2Y \geq X$.

In this case, the gate electrode 103 is formed outside the recess formed in the side surface of the SiGe layer 107. This further increases the film thickness of the insulating film 110b. As a result, the parasitic capacitance produced between the gate electrode 103 and the SiGe layer 107 can further be reduced.

Figure 4:
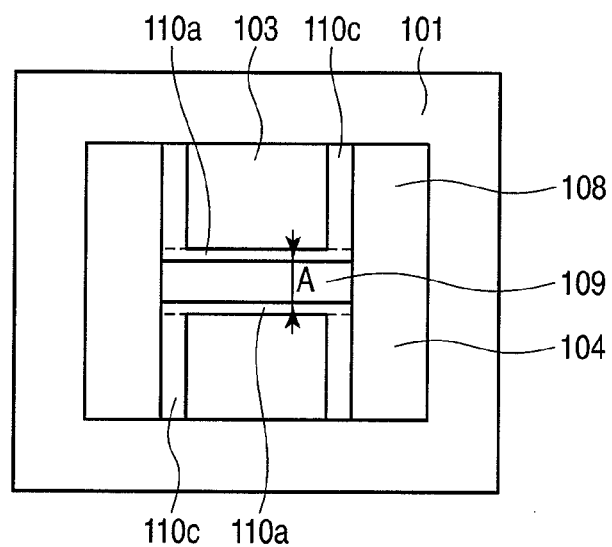
FIG. 4 is a plan view along line IV-IV in FIG. 2.

FIG. 4 is a schematic plan view of a GAA transistor along line IV-IV in FIG. 2.

As shown in FIG. 4, the film thickness of the insulating film 110c formed on the side surface of the Si layer 108 is larger than that of the gate insulating film 110a formed around the periphery of the nanowire channel 109. This enables a reduction in a parasitic capacitance produced between the gate electrode 103 and the Si layer 108.

In the present embodiment, the film thickness of each of the insulating films 110b and 110c formed on the respective side surfaces of the SiGe layer 107 and Si layer 108, functioning as the source/drain region, is larger than that of the gate insulating film 110a, formed around the periphery of the nanowire channel 109. Thus, a parasitic capacitance produced between the gate electrode 103 and both the SiGe layer 107 and Si layer 108, functioning as the source/drain region can be reduced. This enables a reduction in the adverse effect of the parasitic capacitance on the speed at which the voltage of the gate electrode is increased or reduced in response to an applied voltage.

In the description of the embodiment of the present invention, a large number of stacked structures of the SiGe layer and the Si layer are stacked on the silicon substrate. However, the embodiment of the present invention is not limited to this aspect. For example, a GAA transistor may be formed by stacking a large number of stacked structures each composed of two semiconductor layers having different structures and each formed of one of Si, SiGe, SiC, and SiGeC.

(2) Manufacturing Method

An example of a manufacturing method according to the embodiment of the present invention will be described with reference to FIGS. 5 to 21.

Figure 5:
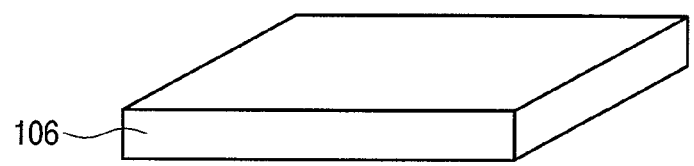

First, as shown in FIG. 5, P-type impurity ions are implanted in a silicon substrate to form a P+-type silicon substrate 106. The purpose of the implantation is to prevent a parasitic channel from being formed on the silicon substrate 106.

Figure 6:
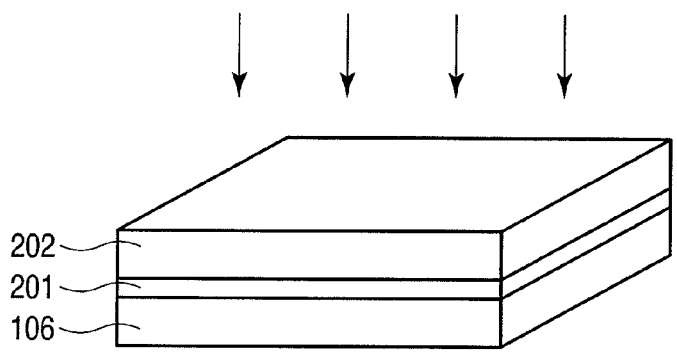

Then, as shown in FIG. 6, a SiGe layer 201 and a Si layer 202 serving as a nanowire channel and a source/drain are sequentially formed on the silicon substrate 106 by epitaxial growth.

Moreover, N-type impurity ions are implanted in the SiGe layer 201 until the concentration of impurities reaches about $1 \times e^{20}/cm^3$. For example, phosphorous (P) or arsenic (As) is used as the N-type impurities.

In the description of the manufacturing method according to the embodiment of the present invention, a single stacked structure composed of the SiGe layer 201 and the Si layer 202 is provided. However, multiple layers of a stacked structure of the SiGe layer 201 and the Si layer 202 may be formed by repeating a step, a number of times, of epitaxially growing the SiGe layer 201 and the Si layer 202 and implanting N-type impurity ions into the SiGe layer 201.

Figure 7:
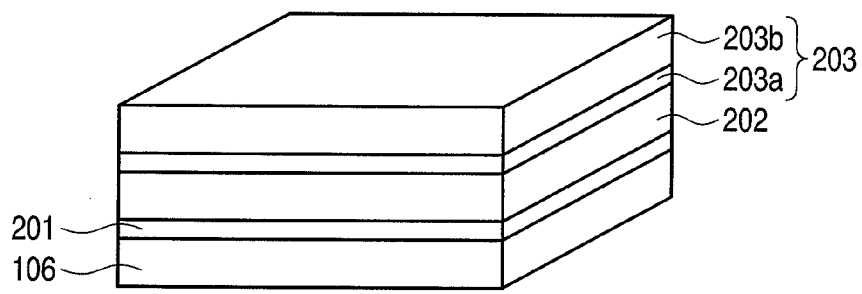

Then, as shown in FIG. 7, a mask material 203 used as an etching mask for the nanowire channel is formed on the Si layer 202 by the plasma CVD method. The mask material 203 is, for example, a stacked film of a silicon nitride film 203a and a silicon oxide film 203b.

Figure 8:
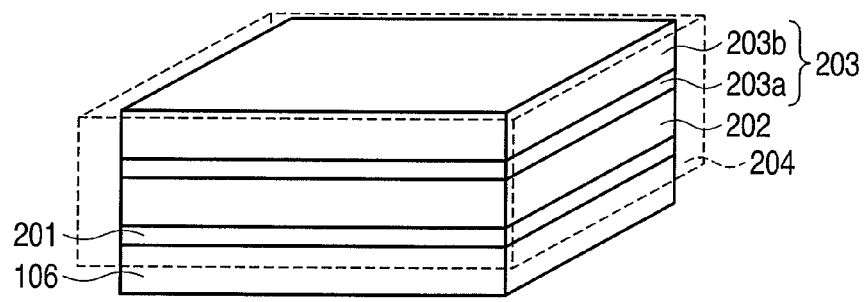

Then, as shown in FIG. 8, patterning is performed such that the mask material 203 remains in a region in which a GAA transistor is to be formed. Thereafter, a trench serving as a shallow trench isolation (STI) is formed by, for example, the RIE method.

Thereafter, an isolation insulating film 204 is buried in the trench by the plasma CVD method. The isolation film 204 is, for example, a silicon oxide film. Moreover, the isolation insulating film 204 buried in the trench is flattened by the CMP method. Thus, the isolation insulating film 204 is formed to have an STI structure.

Figure 9:
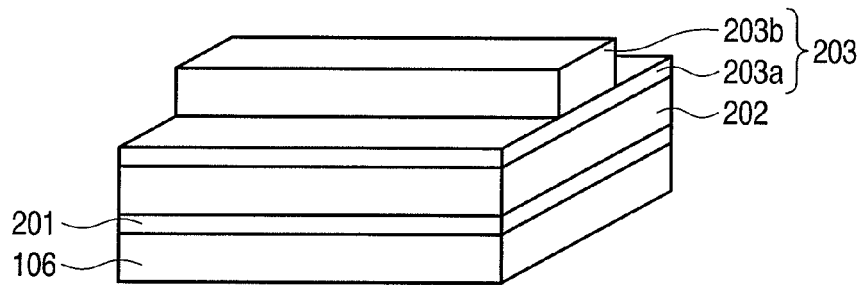

Then, as shown in FIG. 9, the silicon oxide film 203b is processed by a lithography step and the RIE method to form the desired nanowire pattern.

Figure 10:
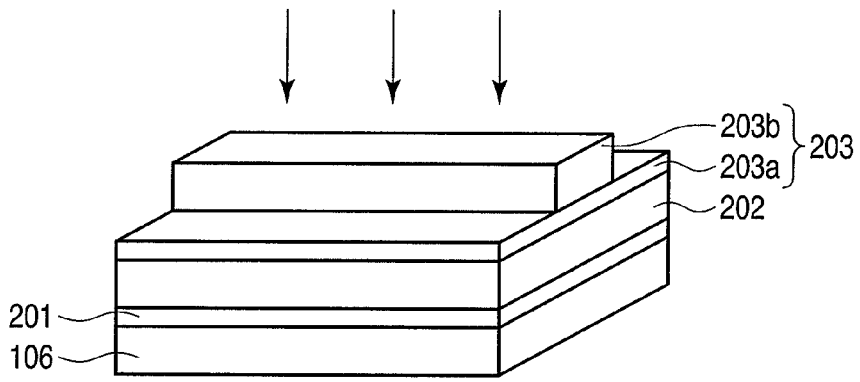

Then, as shown in FIG. 10, for example, N-type impurity ions are implanted in regions of the Si layer 202 in which the silicon oxide film 203b is not formed. The N-type impurities are, for example, phosphorous or arsenic.

Figure 11:
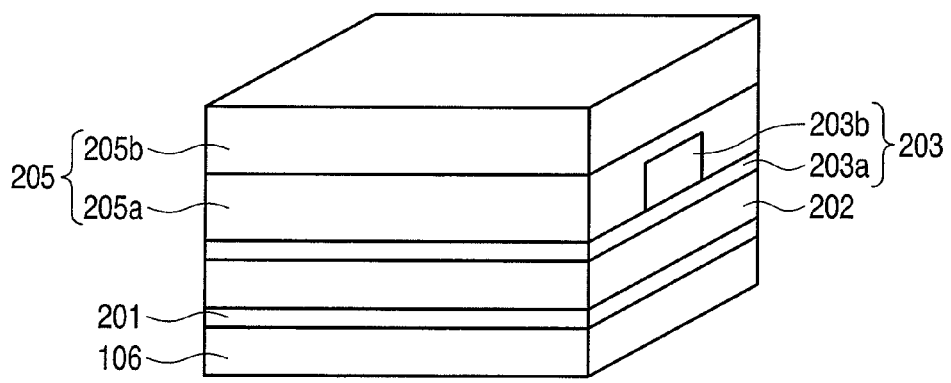

Then, as shown in FIG. 11, a mask material 205 used to form a damascene gate trench by etching is deposited by, for example, the plasma CVD method. The mask material 205 is, for example, a stacked film of a silicon nitride film 205a and a silicon oxide film 205b.

Then, as shown in FIG. 12, the silicon oxide film 205b is selectively etched and then the silicon nitride films 203a and 205a are selectively etched by the lithography step and the RIE method. Thus, a damascene gate trench is formed in which a gate electrode is to be formed.

At this time, the silicon nitride film 203a and silicon oxide film 203b formed on the region in which a nanowire channel is to be formed remain selectively.

Then, as shown in FIG. 13, the Si layer 202 is etched into a wire form by, for example, the RIE method using the silicon oxide films 203b and 205b as a mask.

At this time, as shown in FIG. 14, overetching is performed to remove the silicon oxide film 205b and then to selectively remove the silicon nitride film 203a and silicon oxygen film 203b on the Si layer 202 in which a nanowire is to be formed.

Then, as shown in FIG. 15, the SiGe layer 201 formed under the region of the Si layer 202 in which a nanowire channel is to be formed is isotropically etched. Here, if the isotropic etching is performed in the form of dry etching, for example, a gas containing chlorine trifluoride ($ClF_3$) may be used. If the isotropic etching is performed in the form of wet etching, for example, fluoronitric acid may be used as an etchant.

In this case, SiGe layer 201 is etched so as to expose the entire circumference of the region of the Si layer 202 in which a nanowire channel is to be formed.

FIG. 16 is a sectional view along line A-A in FIG. 15.

As shown in FIG. 16, the SiGe layer 201 is isotropically etched to recess the side surface of the SiGe layer 201.

Furthermore, the region of the Si layer 202 in which a nanowire channel is to be formed has a cross section shaped like a rectangle in the channel width direction. To deform the rectangle into a circle, for example, an additional annealing step may be executed in an $H_2$ atmosphere at about 800 degrees.

Moreover, P-type impurity ions may be obliquely implanted in the region in which a nanowire channel is to be formed until the concentration of the impurities reaches about $1 \times e^{17}/cm^3$, before an annealing step is executed for crystal recovery.

Subsequent FIGS. 17 to 21 are sectional views along line A-A in FIG. 15.

Then, as shown in FIG. 17, a thermal treatment at 900 degrees is performed in, for example, the atmosphere of a gaseous mixture of nitrogen ($N_2$), oxygen ($O_2$), and hydrogen chloride (HCl). Thus, a silicon oxide film 206 functioning as an insulating film is formed to the desired thickness. The silicon oxide film 206 includes a silicon oxide film 206a formed around the periphery of the region of the Si layer 202 in which a nanowire channel is to be formed, a silicon oxide film 206b formed on the side surface of the SiGe layer 201, and a silicon oxide film (not shown in the drawings) formed on the side surface of the region of the Si layer 202 in which a nanowire channel is not to be formed.

In this case, since the side surface of the SiGe layer 201 is recessed, the film thickness of the silicon oxide film 206b is larger than that of the silicon oxide film 206a.

Moreover, the N-type impurities are doped in the SiGe layer 201. Thus, the enhanced oxidation effect of the impurities makes the formation speed of the silicon oxide film 206b higher than that of the silicon oxide film 206a. Consequently, the silicon oxide film 206b is formed to be thicker than the silicon oxide film 206a. Even if P-type impurities are implanted in the region in which a nanowire channel is to be formed, the concentration ($1 \times e^{17}/cm^3$) of impurities in the region in which a nanowire channel is to be formed is negligibly lower than that ($1 \times e^{20}/cm^3$) of impurities in the SiGe layer 201. Thus, the effect of the enhanced isolation on the region in which a nanowire channel is to be formed is negligible compared to that on the side surface of the SiGe layer 201.

Furthermore, the N-type impurities are also doped in the region of the Si layer 202 in which a nanowire channel is not to be formed. Thus, the effect of the enhanced oxidation of the impurities makes the speed at which a silicon oxide film is formed on the side surface of the region of the Si layer 202 in which a nanowire channel is not to be formed, higher than that at which the silicon oxide film 206a is formed. Consequently, the silicon oxide film formed on the side surface of the region of the Si layer 202 in which a nanowire channel is not to be formed can be formed to be thicker than the silicon oxide film 206a.

Figure 18:
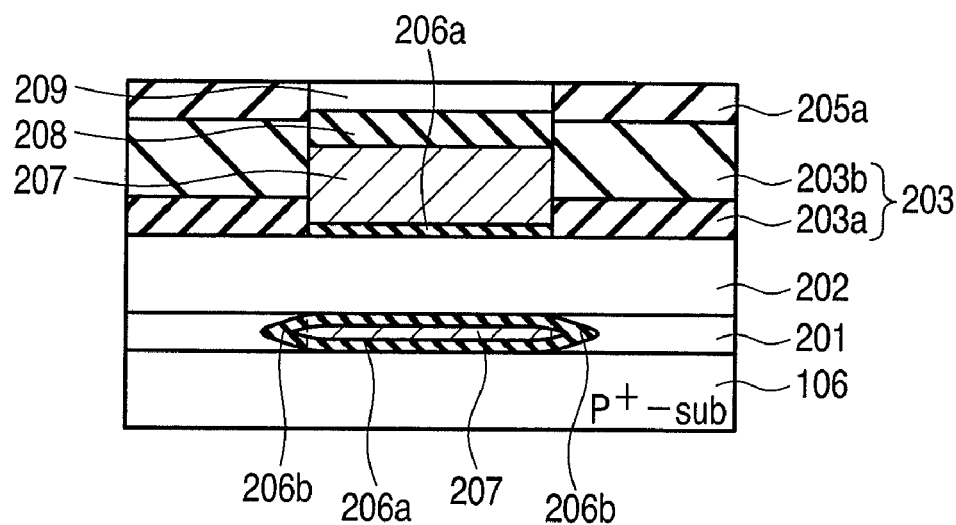

Then, as shown in FIG. 18, a metal compound 207 is buried in the damascene gate trench by the metal CVD method. For example, a compound of titanium nitride and tungsten is used as the metal compound 207. Thereafter, the metal compound 207 is flattened by CMP. Subsequently, a recess is formed on the metal compound 207 by the RIE method. Moreover, a silicon nitride film 208 and an α-silicon layer 209 are formed in the recess by the CVD method. Thereafter, an α-silicon layer 209 is flattened by the CMP method.

Figure 19:
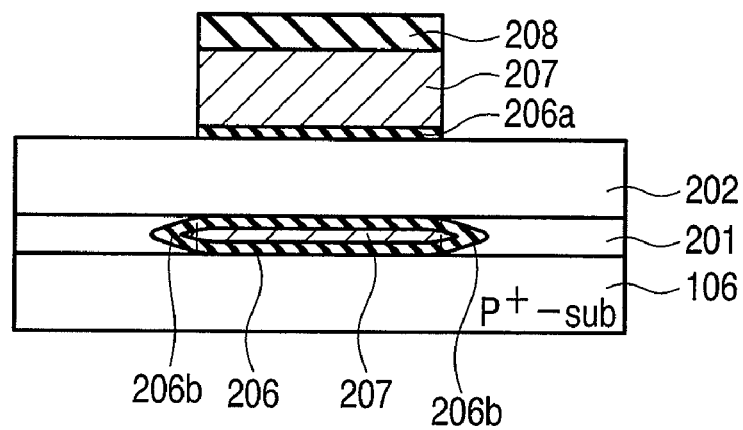

Then, as shown in FIG. 19, the silicon nitride film 203a, the silicon oxide film 203b, and the silicon nitride film 205a are selectively removed through the α-silicon layer 209 as a mask. Thereafter, the α-silicon layer 209 is removed.

Figure 20:
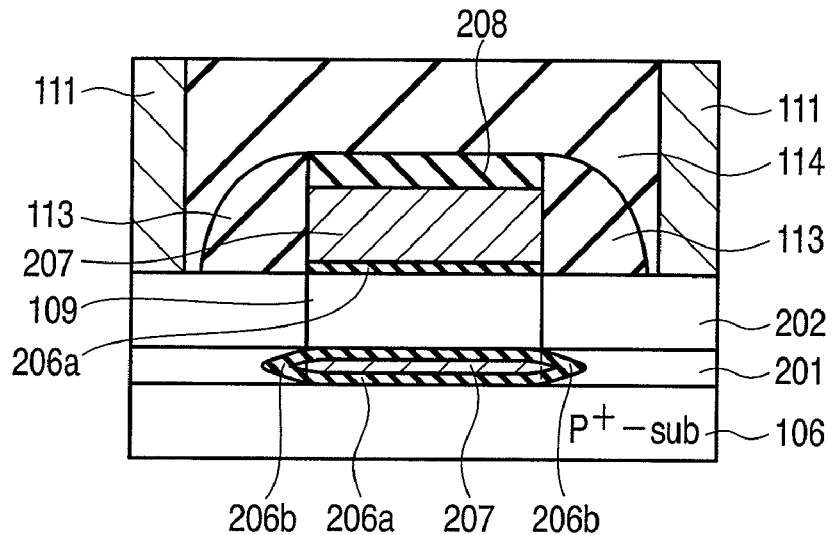

Then, as shown in FIG. 20, a nanowire channel 109 is formed in the wire-like Si layer 202 using a normal process.

Thereafter, insulating films 113 are formed on the respective side surfaces of metal compound 207. Furthermore, an insulating film 114 is formed on the Si layer 202, the silicon nitride film 208, and the insulating film 113 using a normal process. Moreover, contact holes are formed in the insulating film 114. Contact plugs 111 are then formed in the respective contact holes.

Figure 21:
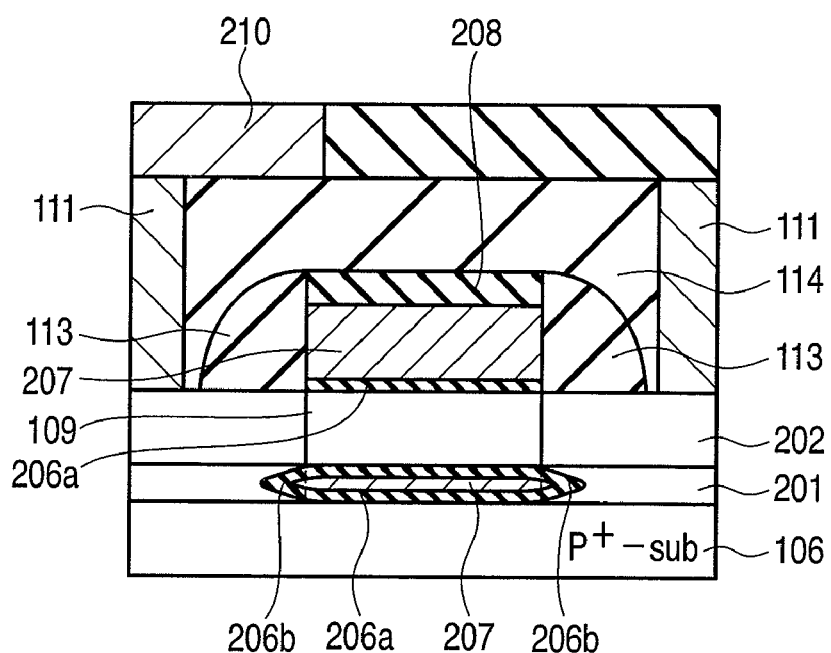

Thereafter, as shown in FIG. 21, an interconnection layer 210 is formed to complete a GAA transistor according to the embodiment of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a silicon substrate;
   two first semiconductor layers on the silicon substrate at a predetermined distance from each other;
   two second semiconductor layers on the respective first semiconductor layers and comprising a material different from a material of the first semiconductor layers;
   a first channel region between the two second semiconductor layers in a shape of a wire;
   a first insulating layer around the first channel region;
   a second insulating film on second side surfaces of the two first semiconductor layers, the second side surfaces facing each other;
   a third insulating film on third side surfaces of the two second semiconductor layers, the third side surfaces facing each other; and
   a gate electrode on the first, second, and third insulating films,
   wherein the second insulating film is thicker than the first insulating film.

2. The semiconductor device of claim 1, wherein first side surfaces of the two first semiconductor layers are recessed.

3. The semiconductor device of claim 2, wherein the recess comprises the second insulating film.

4. The semiconductor device of claim 3, wherein the first semiconductor layer is at most twice as thick as the third insulating film.

5. The semiconductor device of claim 1, wherein the third insulating layer is thicker than the first insulating film.

6. The semiconductor device of claim 1, wherein the first and second semiconductor layers comprises Silicon (Si), Silicon-Germanium (SiGe), Silicon carbide (SiC), or Silicon-Germanium carbide (SiGeC).

7. The semiconductor device of claim 1, wherein the first semiconductor layer comprises an impurity of a first conductivity type,
   the first channel region comprises an impurity of a second conductivity type opposite to the first conductivity type, and
   impurity density of the first conductivity type in the first semiconductor layer is higher than impurity density of the second conductivity type in the first channel region.

8. The semiconductor device of claim 5, wherein the second semiconductor layer comprises an impurity of the first conductivity type,
   the first channel region comprises an impurity of the second conductivity type opposite to the first conductivity type, and
   impurity density of the first conductivity type in the second semiconductor layer is higher than impurity density of the second conductivity type in the first channel region.

9. The semiconductor device of claim 1, further comprising:
   two third semiconductor layers on the respective second semiconductor layers and comprising the material of the first semiconductor layers;
   two fourth semiconductor layers on the respective third semiconductor layers and comprising the material of the second semiconductor layers; and
   a second channel region between the two fourth semiconductor layers in a shape of a wire,
   wherein the first insulating layer is around the second channel region,
   the second insulating film is on second side surfaces of the two third semiconductor layers, the second side surfaces facing each other, and
   the third insulating film is on third side surfaces of the two third semiconductor layers, the third side surfaces facing each other.

10. A method for manufacturing a semiconductor device, the method comprising:
   sequentially stacking a first semiconductor layer and a second semiconductor layer on a silicon substrate, the second semiconductor layer comprising a material different from a material of the first semiconductor layer;
   forming source/drain regions comprising the first semiconductor layer and the second semiconductor layer and a channel formation region comprising the first semiconductor layer and the second semiconductor layer by processing the second semiconductor layer, the channel formation region being positioned between the source/drain regions;
   forming a wire-like channel region comprising the second semiconductor layer by removing the first semiconductor layer in a lower portion of the channel formation region by isotropic etching;
   forming a first insulating film, a second insulating film, and a third insulating film around the second semiconductor layer in the channel region, on a side surface of the first semiconductor layer in the source/drain regions, and on a side surface of the second semiconductor layer in the source/drain regions by a thermal treatment in an atmosphere comprising gaseous oxygen; and forming a gate electrode on the first, second, and third insulating films, wherein the second insulating film is thicker than the first insulating film.

11. The method of claim 10, wherein the isotropic etching is dry etching using a gas comprising chlorine trifluoride or wet etching using fluoronitric acid.

12. The method of claim 10, further comprising:

implanting an impurity of a first conductivity type in the first semiconductor layer in the source/drain regions, and implanting an impurity of a second conductivity type opposite to the first conductivity type, in the second semiconductor layer in the channel region before the forming of the first and second insulating films, wherein the impurity density of the first conductivity type in the first semiconductor layer in the source/drain regions is higher than the impurity density of the second conductivity type in the second semiconductor layer in the channel region.

13. The method of claim 10, further comprising:

implanting an impurity of a first conductivity type in the second semiconductor layer in the source/drain regions, and implanting an impurity of a second conductivity type opposite to the first conductivity type in the second semiconductor layer in the channel region before the forming of the first and second insulating films, wherein impurity density of the first conductivity type in the second semiconductor layer in the source/drain regions is higher than the impurity density of the second conductivity type in the semiconductor layer in the channel region, and the third insulating film is thicker than the first insulating film.

* * * * *